US011329608B1

(12) United States Patent
Jefremow et al.

(10) Patent No.: US 11,329,608 B1
(45) Date of Patent: May 10, 2022

(54) OSCILLATOR CIRCUIT WITH NEGATIVE RESISTANCE MARGIN TESTING

(71) Applicant: Infineon Technologies AG, Neubiberg (DE)

(72) Inventors: Mihail Jefremow, Augsburg (DE); Rex Kho, Holzkirchen (DE); Ralph Mueller-Eschenbach, Munich (DE); Juergen Schaefer, Oberhaching (DE); Arndt Voigtlaender, Ottobrunn (DE); Wei Wang, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/078,484

(22) Filed: Oct. 23, 2020

(51) Int. Cl.
 *H03B 5/36* (2006.01)
 *H03B 7/06* (2006.01)

(52) U.S. Cl.
 CPC ............... *H03B 5/36* (2013.01); *H03B 7/06* (2013.01); *H03B 2200/0064* (2013.01)

(58) Field of Classification Search
 CPC ... H03B 5/30; H03B 5/32; H03B 5/36; H03B 5/362; H03B 5/364; H03B 5/366
 See application file for complete search history.

(56) References Cited

U.S. PATENT DOCUMENTS

| 6,825,736 | B1* | 11/2004 | Kehler | H03L 5/00 331/109 |
| 7,123,109 | B2* | 10/2006 | Stevenson | H03B 5/06 331/109 |
| 2004/0212443 | A1* | 10/2004 | Godambe | H03B 5/1278 331/173 |
| 2015/0028956 | A1* | 1/2015 | Okamoto | H03L 7/0805 331/18 |
| 2018/0138860 | A1* | 5/2018 | Zhang | H03B 5/1228 |
| 2019/0173426 | A1* | 6/2019 | Marchand | H03B 5/04 |

FOREIGN PATENT DOCUMENTS

| EP | 2833545 A1 * | 2/2015 | ............. H03B 5/366 |
| JP | 2007116563 A * | 5/2007 | |

OTHER PUBLICATIONS

Kjørlaug, "AN2648: Selecting and Testing 32 KHz Crystal Oscillators for AVR Microcontrollers", 2018, retrieved from http://ww1.microchip.com/downloads/en/Appnotes/AN2648-Selecting_Testing-32KHz-Crystal-Osc-for-AVR-MCUs-00002648B.pdf on Aug. 10, 2021 (Year: 2018).*

* cited by examiner

*Primary Examiner* — Ryan Johnson
(74) *Attorney, Agent, or Firm* — Eschweiler & Potashnik, LLC

(57) ABSTRACT

Systems, methods, and circuits are provided for facilitating negative resistance margin testing in an oscillator circuit. An example oscillator circuit includes amplifier circuitry configured to be coupled in parallel with a resonator and variable resistance circuitry configured to, in response to a resistance control signal, adjust a resistance of the oscillator circuit.

12 Claims, 13 Drawing Sheets

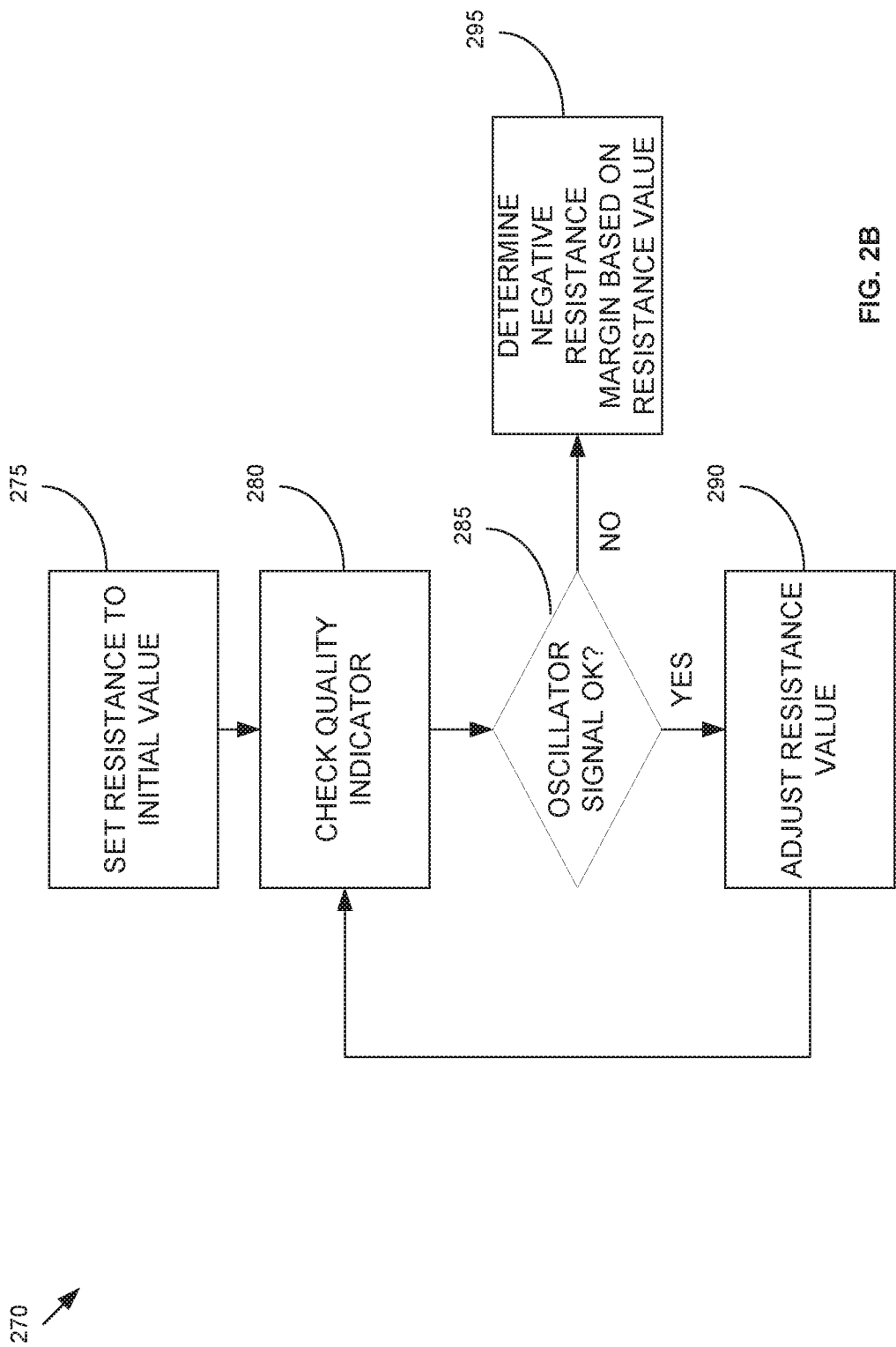

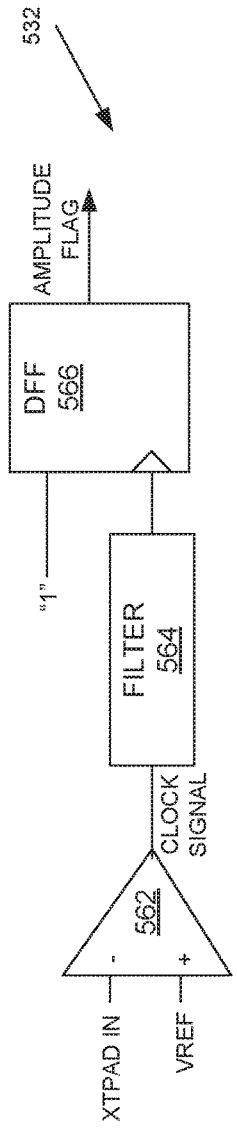
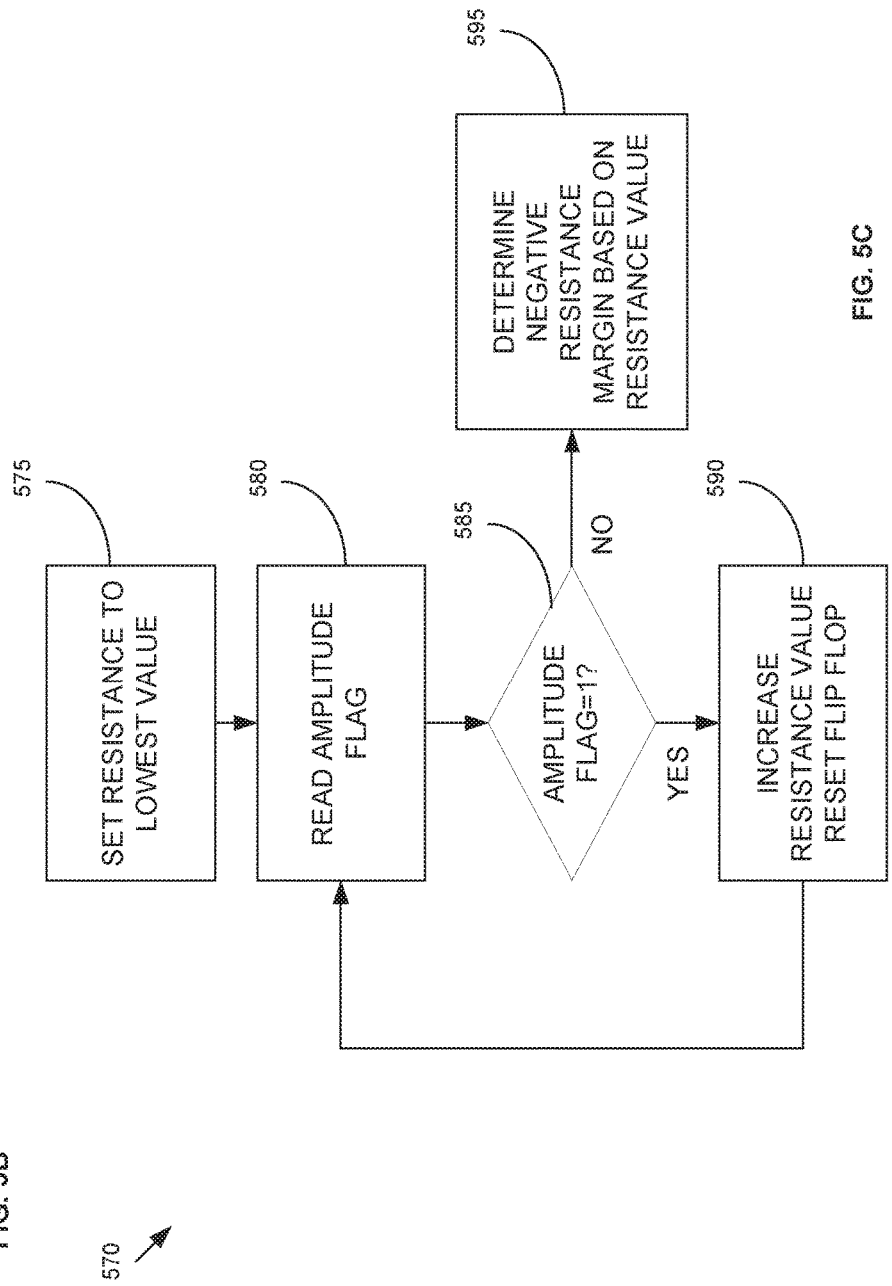
FIG. 5B
FIG. 5C

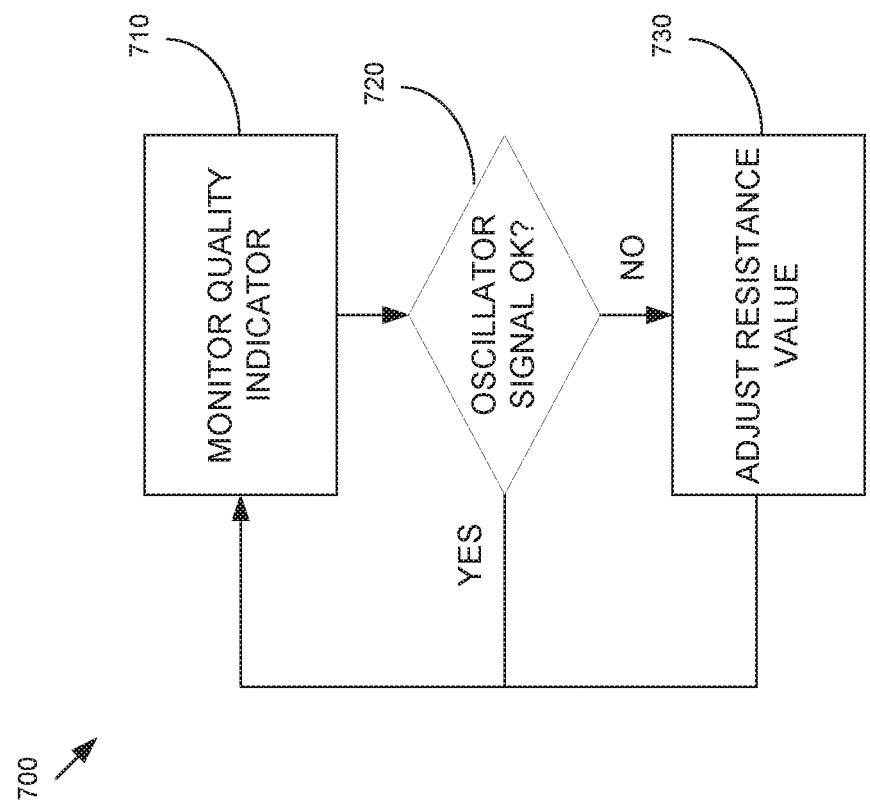

OSCILLATOR CIRCUIT WITH NEGATIVE RESISTANCE MARGIN TESTING

FIELD

The present disclosure relates to the field of oscillator circuits and in particular to methods, systems, and circuitry for testing a negative resistance design margin of an oscillator circuit.

BACKGROUND

Modern microcontrollers include oscillator circuits that utilize resonators, such as quartz crystals or ceramic resonators, for generating clock signals. A microcontroller may be sold without the resonator to a Tier 1 or an original equipment manufacturer (OEM). In this case the resonator is installed by the Tier 1 or (OEM) in a final system, such as a printed circuit board (PCB). This final system may be an engine control unit (ECU) that includes the microcontroller. The Tier 1 or OEM may have difficulty in predicting ECU performance issues that may occur in mass production of the PCB due to, for example, process variations of the microcontroller and temperature dependence of the final system including the PCB and the resonator.

BRIEF DESCRIPTION OF THE DRAWINGS

Some examples of circuits, apparatuses and/or methods will be described in the following by way of example only. In this context, reference will be made to the accompanying Figures.

FIG. 2B is a flow diagram outlining an exemplary method for estimating a negative resistance margin of the oscillator circuit in accordance with various aspects described.

FIG. 5B is a block diagram of an exemplary voltage detector, in accordance with various aspects described.

FIG. 5C is a flow diagram outlining an exemplary method for estimating a negative resistance margin of the oscillator circuit in accordance with various aspects described.

FIG. 7 is a flow diagram outlining an exemplary method for dynamically controlling a variable resistance of an oscillator circuit in accordance with various aspects described.

DETAILED DESCRIPTION

Figure 1:
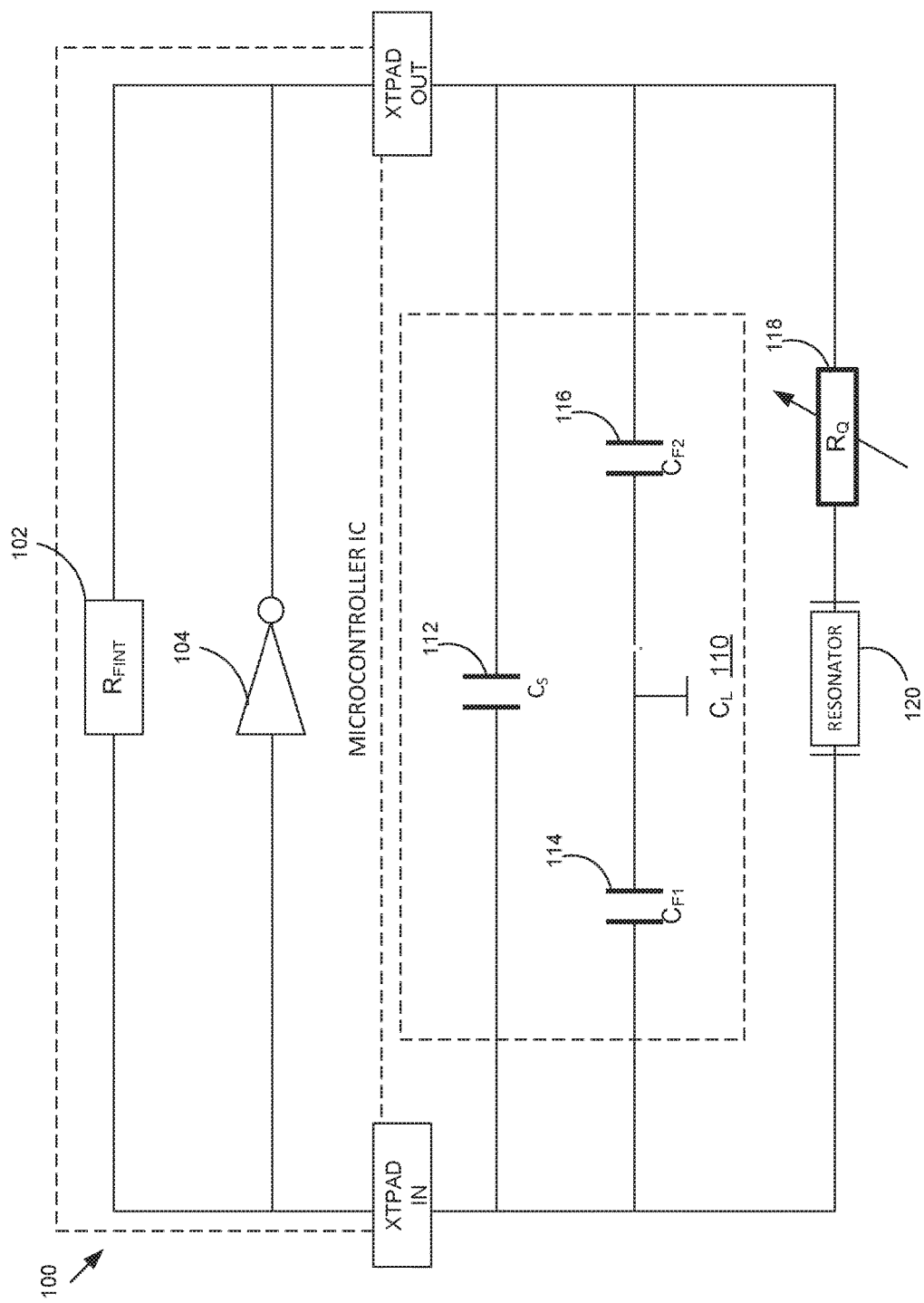
FIG. 1 is a block diagram of an oscillator circuit that has been modified with a variable resistor to perform margin testing circuitry.

FIG. 1 illustrates an exemplary oscillator system 100, which may be used by a microcontroller to generate clock signals. In one example, the microcontroller is implemented on an integrated circuit (IC). The oscillator system 100 includes some components that are implemented in the microcontroller IC and other components that are implemented in a PCB (not shown) on which the IC is installed to produce a final system (e.g., ECU). The oscillator system 100 includes, in the IC, a primary amplifier 104 and a feedback resistor $R_{FINT}$ 102 connected in parallel with one another. The microcontroller IC includes an input pad or pin XTPAD IN and an output pad or pin XTPAD OUT to which a resonator 120 (e.g., quartz crystal) having desired oscillation properties is coupled when the microcontroller IC is installed on a PCB. The oscillator system 100 exhibits a load capacitance $C_L$ 110, which includes capacitive effects of stray capacitance $C_S$ 112 (e.g., microcontroller pin capacitance, printed circuit board (PCB) capacitance, and so on) and two footprint capacitors $C_{F1}$ and $C_{F2}$.

To test a negative resistance margin (or oscillation allowance margin) of the oscillator system, in a laboratory setting the PCB is modified to include a variable resistor $R_Q$ in series with the resonator 120. The oscillator signal generated by the oscillator system is monitored at XTPAD IN while the value of $R_Q$ is swept up from a low resistance value, causing the amplitude of the oscillator signal to decrease. When the amplitude of the oscillator signal reaches nearly zero (e.g., becomes unacceptably low for use in generating clock signals) the value of $R_Q$ is determined to represent the negative resistance of the oscillator system. This negative resistance indicates the additional resistance (e.g., due to process variation or temperature variation) that can be tolerated by the oscillator system 100.

The negative resistance is used to determine a design margin for the oscillator system that quantifies how much variation in resonator and other components may occur before the oscillator system will malfunction. Ideally, this negative resistance test would be performed on many samples of the oscillator systems with different silicon production lot materials of the oscillator system and at different temperatures to determine the design margin. However, due to the fact that the PCB is manually modified (and possibly made unusable for end product) to perform the negative resistance test, it becomes burdensome to test a significant number of samples.

Figure 2A:
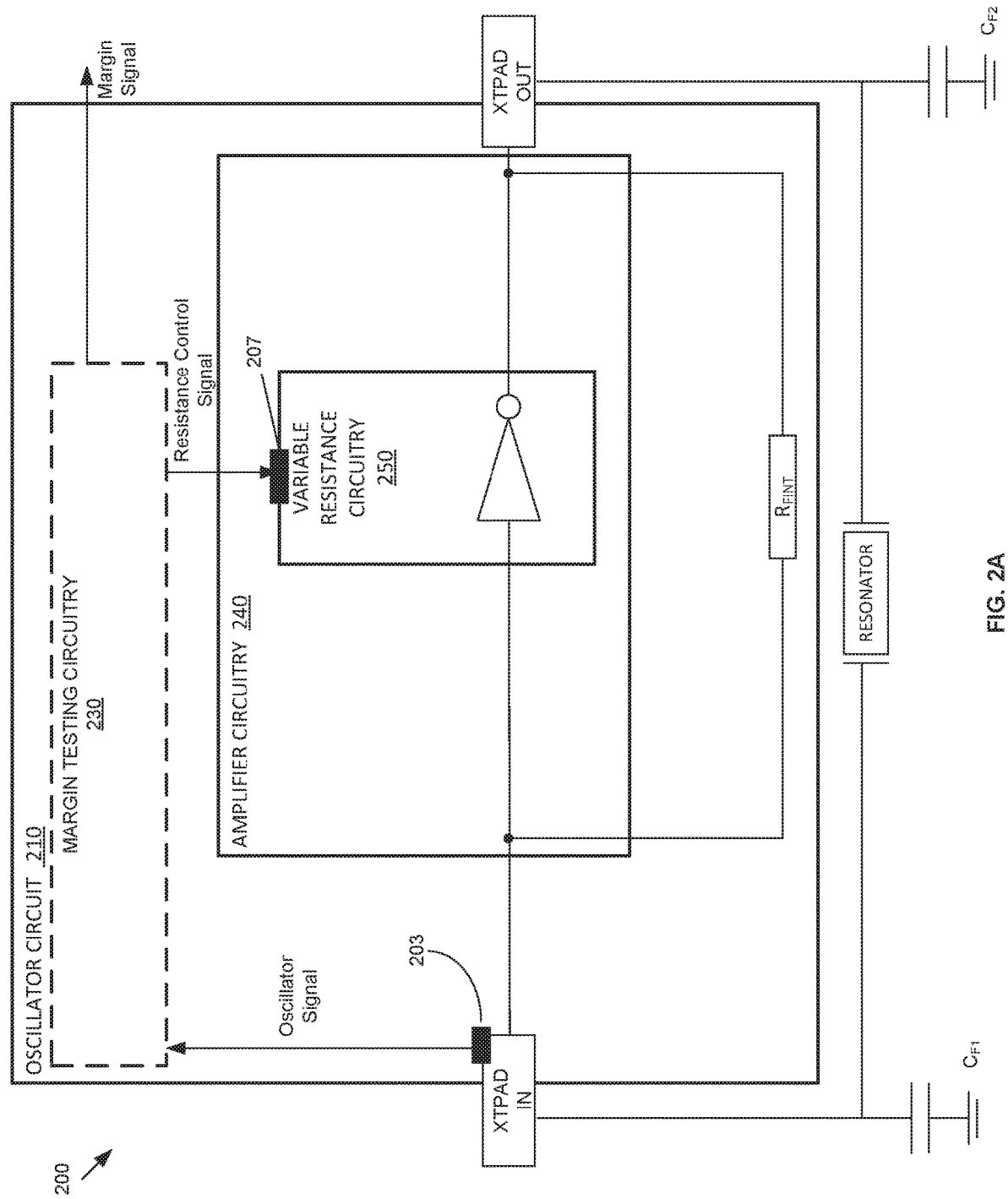
FIG. 2A is a block diagram of an exemplary oscillator circuit that includes variable resistance circuitry and margin testing circuitry that adjusts a negative resistance of the oscillator circuit, in accordance with various aspects discussed.

Described herein are methods, systems, and circuitries that provide an oscillator circuit with a built-in means for adjusting a resistance of the oscillator circuit to facilitate negative resistance margin testing of the final system (e.g., ECU) under application conditions. FIG. 2A illustrates an exemplary oscillator system 200 that includes an oscillator circuit 210 (e.g., those components of the oscillator system that are embodied in a microcontroller IC). The oscillator circuit 210 is configured to be coupled to a resonator and footprint capacitors $C_{F1}$ and $C_{F2}$ by way of an input pad XTPAD IN and an output pad XTPAD OUT. The resonator and footprint capacitors as well as a microcontroller IC that includes the oscillator circuit 210 may be installed on a PCB. The oscillator system 200 generates an oscillator signal that is used to generate various clock and synchronization signals for the various functional blocks like CPUs, communication interfaces, analog to digital convertors (ADCs), and so on, of the microcontroller.

The oscillator circuit 210 includes amplifier circuitry 240 that is connected in parallel with the resonator. The amplifier circuitry 240 serves as an inverter and an amplifier in the oscillator circuit 210. The amplifier circuitry 240 may include multiple gain stages as will be illustrated in the following examples. However, the described negative resistance margin testing techniques and circuitries need not be implemented with a multi-stage amplifier. The amplifier circuitry 240 includes variable resistance circuitry 250 which, in response to a resistance control signal, can be controlled to provide variable resistance in parallel with the resonator in the oscillator circuit 210. In other examples, the variable resistance may be in series or other combination with the resonator.

The oscillator circuit 210 includes a sensing interface feature 203 and a control interface feature 207. The sensing interface feature 203 provides an externally accessible connection or sensing feature that may be accessed by a probe or other sensing tool to monitor the oscillator signal. The sensing interface feature 203 may be a pin, pad, socket, connector or other appropriate conductive feature. The sensing interface feature 203 may be multiplexed with other interface features. While the sensing interface feature 203 is shown connected to the XTPAD IN, the sensing interface feature may be located in any other location of the oscillator circuit that provides access to the oscillator signal. The control interface feature 207 provides an externally accessible connection that may be accessed by a lead to provide a resistance control signal to the amplifier circuitry 250. The control interface feature 207 may be a pin, pad, socket, connector, or other appropriate conductive feature. The control interface feature 207 may be multiplexed with other interface features.

The margin testing circuitry 230 provides the resistance control signal to the variable resistance circuitry 250 to adjust a variable resistance value of the variable resistance circuitry 250. For the purposes of this description, variable resistance value is used to identify a particular resistance exhibited by the variable resistance circuitry. Resistance control signal value is used to identify a setting or control signal that results in a corresponding variable resistance value. The resistance control signal value is adjusted to produce different variable resistance values during negative resistance margin testing. The margin testing circuitry 230 monitors the oscillator signal and is able to determine when the oscillator signal's quality (e.g., amplitude or other characteristic) becomes unsatisfactory for its intended use (e.g., generating clock or synchronization signals).

During negative resistance margin testing, the margin testing circuitry controls the variable resistance circuitry, by way of the resistance control signal, to provide increasing (or decreasing, depending on the location of the variable resistance circuitry) variable resistance values. While the resistance is increased, the margin testing circuitry 230 monitors the oscillator signal. The margin testing circuitry determines a negative resistance margin (e.g., an amount of resistance that can be tolerated by the oscillator circuit) based on the variable resistance value at which the oscillator signal quality becomes unsatisfactory. The margin testing circuitry generates a margin signal that indicates this negative resistance margin. The margin signal may be a display or other indicator that communicates the negative resistance margin or a parameter related to the negative resistance margin.

The margin resistance circuitry 230 is shown in dotted line to indicate that the margin testing circuitry may be totally or partially implemented in the oscillator circuit 210 or completely external to the oscillator circuit (e.g., implemented using external laboratory or control equipment).

Referring now to FIG. 2B, a flow diagram outlines an exemplary negative margin test method 270 that may be performed by margin testing circuitry 230. At 275, the variable resistance value is set to an initial value (e.g., a lowest value). At 280, a quality indicator is checked to determine the quality of the oscillator signal. At 285 a determination is made as to whether the oscillator signal is satisfactory. If the oscillator signal is satisfactory, at 290 the variable resistance is adjusted (e.g., increased) and the oscillator signal is checked again at 280. This adjusting of the variable resistance values is performed until the quality indicator indicates that the oscillator signal unsatisfactory at 285. At 295, the negative resistance margin is determined based on the value of the variable resistance when the oscillator signal becomes unsatisfactory. A margin signal indicating the negative resistance margin may be provided or displayed. In one example, the resistance value may be displayed for manual calculation of the negative resistance.

Figure 3:
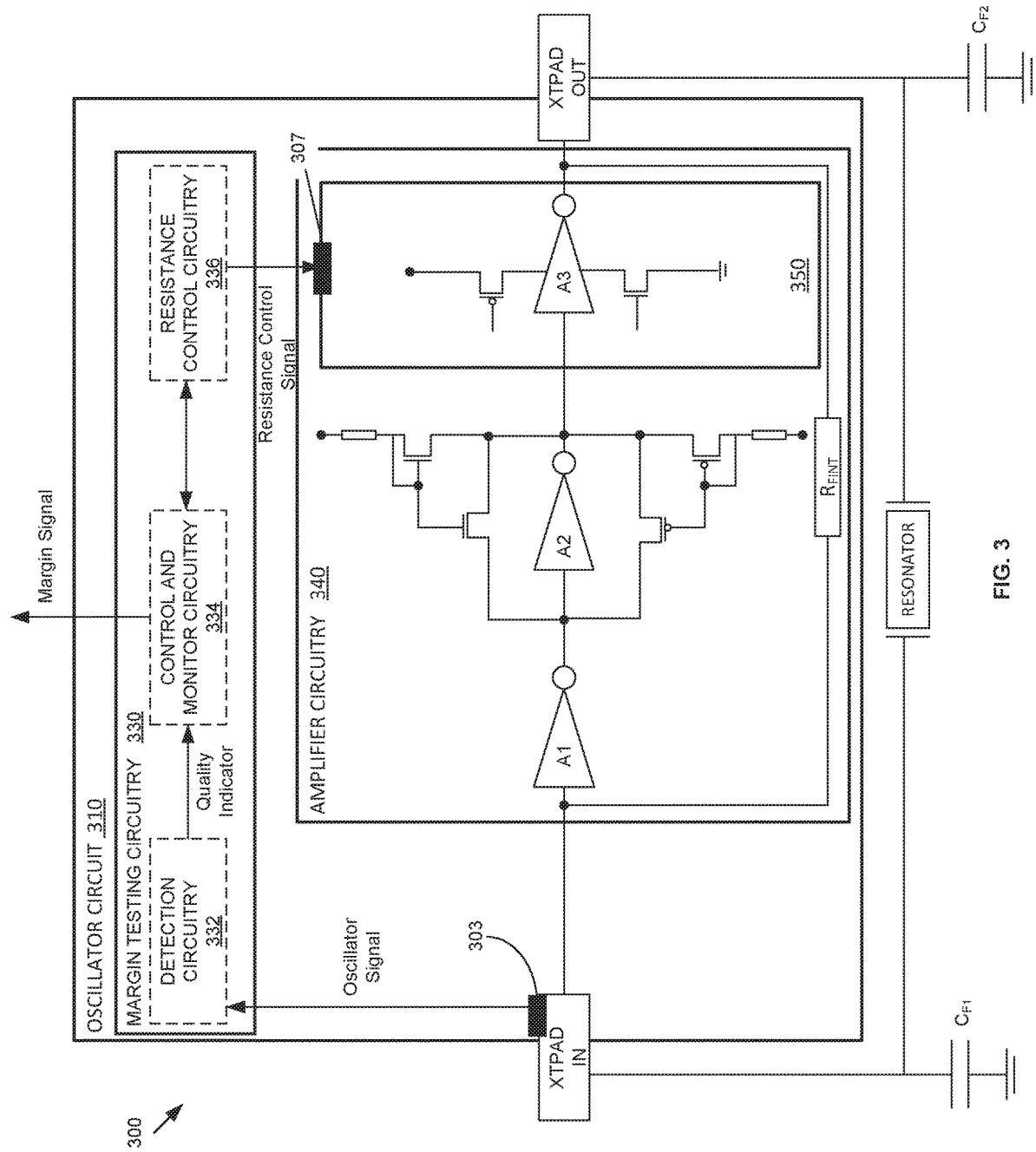
FIG. 3 is a block diagram of an oscillator circuit that includes amplifier circuitry with a variable gain stage and margin testing circuitry that adjust the gain of the variable gain stage to control a negative resistance of the oscillator circuit, in accordance with various aspects discussed.

FIG. 3 illustrates, in more detail, an exemplary oscillator system 300 that supports negative resistance margin testing. The system 300 includes margin testing circuitry 330 and amplifier circuitry 340. The amplifier circuitry includes three gain stages A1, A2, and A3. The output driver stage of the amplifier circuitry A3 has an adjustable gain and serves as variable resistance circuitry 350. In other examples a different amplifier stage may serve as variable resistance circuitry 350.

The margin testing circuitry 330, which may be implemented in hardware or a combination of hardware and stored instructions, includes detection circuitry 332, control and monitor circuitry 334, and resistance control circuitry 336. During negative resistance margin testing the resistance control circuitry 336 provides a resistance control signal that incrementally reduces the gain of the amplifier stage 350. This high to low sweep of gain in the driver stage 350 simulates a low to high sweep of the variable resistance value in the oscillator circuit. Throughout this description, the concepts of increasing the gain of the amplifier stage 350 and reducing the variable resistance value in the oscillator circuit may be used interchangeably.

The control and monitor circuitry 334 monitors the resistance control value and is thus aware of the "variable resistance value" (e.g., gain level of the amplifier stage 350) present in the oscillator circuit at any given time. The detection circuitry 332 is configured to detect when the oscillator signal becomes unsatisfactory (e.g. when the amplitude is too low or signal exhibits jitter) and generate a quality indicator that is communicated to or otherwise accessible by the control and monitor circuitry 334. The quality indicator indicates either a satisfactory oscillator signal or an unsatisfactory oscillator signal. The quality indicator may be, for example, a hardware flag, a register whose contents communicate the whether the oscillator signal is satisfactory, or a trigger or other signal generated by the detection circuitry and transmitted to the control and monitor circuitry 334. The control and monitor circuitry 334 determines the negative resistance margin based on the value of the resistance control signal at the time the quality indicator indicates that the oscillator signal has become unsatisfactory.

Figure 4A:
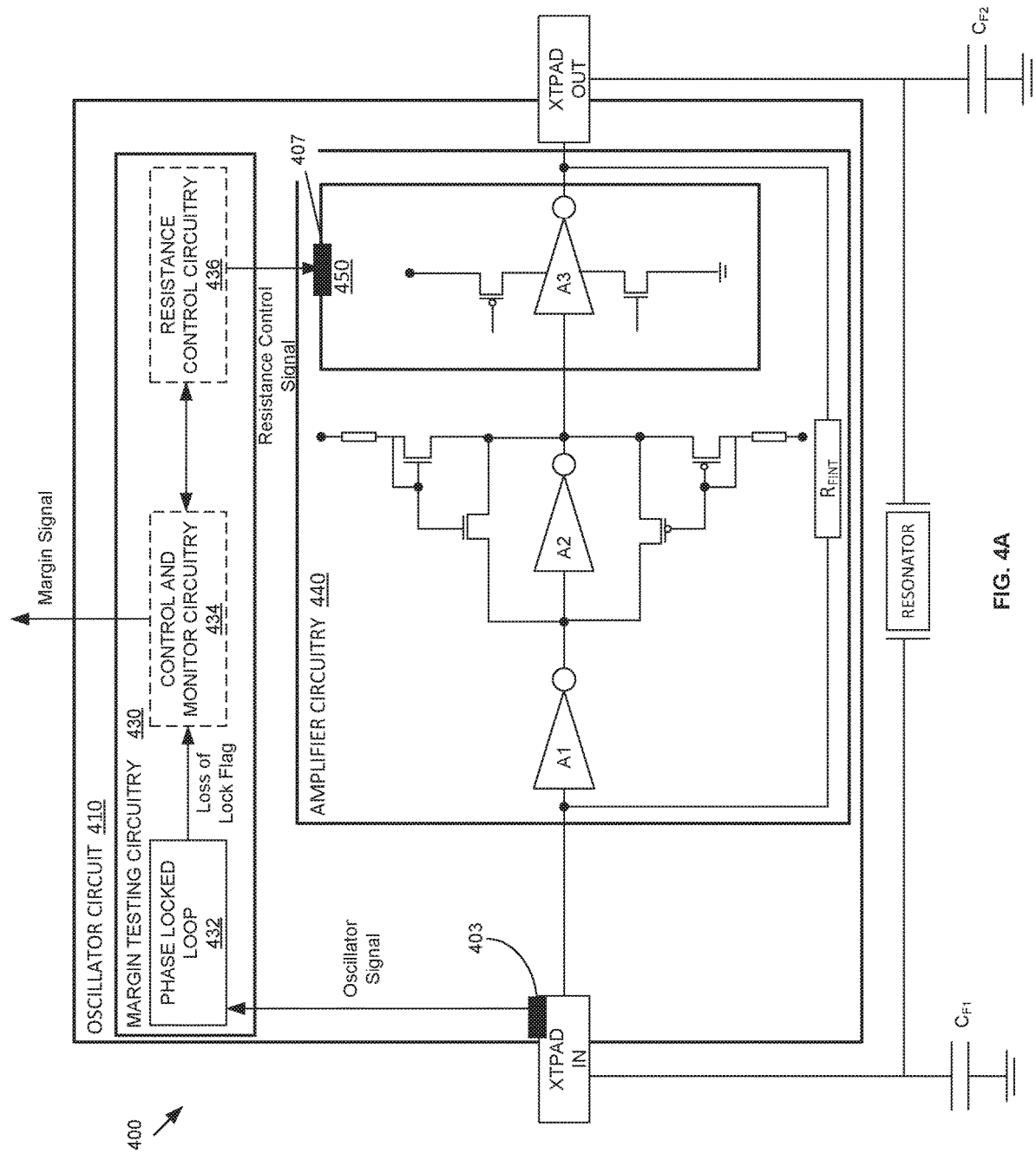
FIG. 4A is a block diagram of an exemplary oscillator circuit having margin testing circuitry that utilizes a phase locked loop (PLL) to detect the quality of the oscillator circuit signal, in accordance with various aspects discussed.

FIG. 4A illustrates an exemplary oscillator system 400 that supports negative resistance margin testing in which detection circuitry includes a phase locked loop (PLL) circuitry 432. Amplifier circuitry 440 includes three gain stages A1, A2, and A3. The output driver stage of the amplifier circuitry A3 has an adjustable gain and serves as variable resistance circuitry 450. In other examples a different amplifier stage may serve as variable resistance circuitry 450.

The margin testing circuitry 430, which may be implemented in hardware or a combination of hardware and stored instructions, includes control and monitor circuitry 434 and resistance control circuitry 436. During negative resistance margin testing the resistance control circuitry 436 sweeps the gain of the amplifier stage 450 from a very high level to incrementally lower values. To accomplish this, the resistance control circuitry 436 provides a resistance control signal that incrementally reduces the gain of the amplifier stage 450. The control and monitor circuitry 434 monitors the resistance control value and is thus aware of the "variable resistance value" (e.g., gain level of the amplifier stage 450) present in the oscillator circuit at any given time.

The PLL circuitry 432, which may be otherwise used by the microcontroller for generating clock or synchronization signals, senses the oscillator signal. The PLL circuitry 432 is configured to set a hardware lock flag when the PLL is able to lock onto the oscillator signal and reset the lock flag when the PLL can no longer lock onto the oscillator signal. Thus, in this example, the PLL circuitry 432 is the detection circuitry and the lock flag is the quality indicator. The control and monitor circuitry 334 monitors the lock flag to determine whether the oscillator signal is satisfactory. The control and monitor circuitry 334 determines the negative resistance margin based on the value of the resistance control signal at the time the lock flag is reset.

Figure 4B:
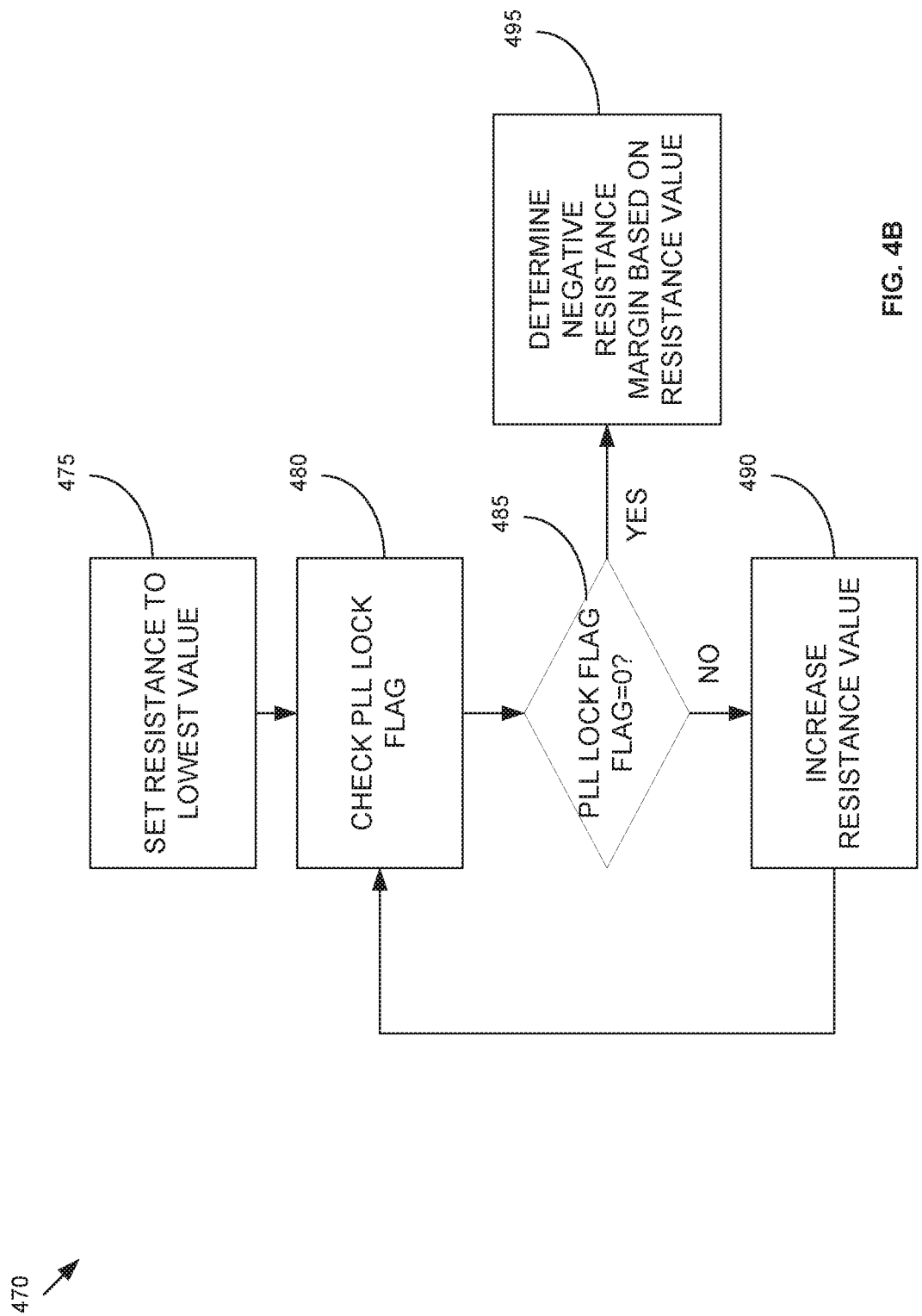
FIG. 4B is a flow diagram outlining an exemplary method for estimating a negative resistance margin of the oscillator circuit in accordance with various aspects described.

Referring now to FIG. 4B, a flow diagram outlines an exemplary negative margin test method 470 that may be performed by margin testing circuitry 430. At 475, the variable resistance value is set to its lowest value (e.g., the gain of the amplifier stage 450 is set to a high value). At 480, the lock flag is checked and at 485 a determination is made as to whether the lock flag has been reset (e.g., equals 0 rather than 1). If the lock flag is set, at 490 the variable resistance is increased (e.g., by reducing the gain of the amplifier stage 450) and the lock flag is checked again at 480. This sweep of increasing variable resistance values is performed until the lock flag has been reset at 485. At 495, the negative resistance margin is determined based on the value of the variable resistance when the lock flag was reset. A margin signal may be provided or displayed that communicates the negative resistance margin. One advantage to the example illustrated in FIG. 4 is that it uses an existing PLL to detect when the oscillator signal becomes unsatisfactory.

Figure 5A:
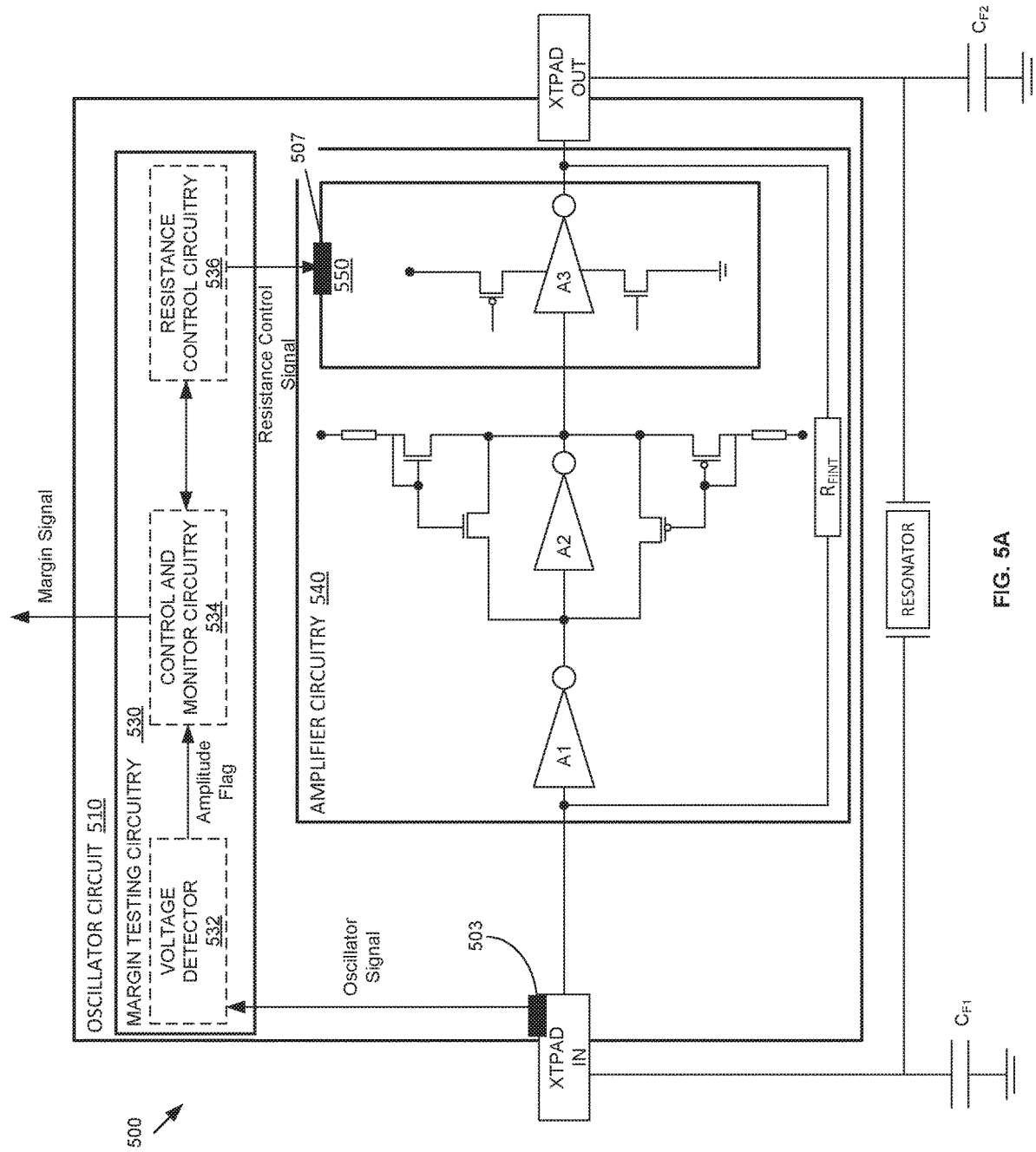
FIG. 5A is a block diagram of an exemplary oscillator circuit having margin testing circuitry that utilizes a voltage detector to detect the quality of the oscillator circuit signal, in accordance with various aspects discussed.

FIG. 5A illustrates an exemplary oscillator system 500 that supports negative resistance margin testing in which detection circuitry includes a voltage detector 532. Amplifier circuitry 540 includes three gain stages A1, A2, and A3. The output driver stage of the amplifier circuitry A3 has an adjustable gain and serves as variable resistance circuitry 550. In other examples a different amplifier stage may serve as variable resistance circuitry 550.

The margin testing circuitry 530, which may be implemented in hardware or a combination of hardware and stored instructions, includes control and monitor circuitry 534 and resistance control circuitry 536. During negative resistance margin testing the resistance control circuitry 536 provides a resistance control signal that incrementally reduces the gain of the amplifier stage 550. The control and monitor circuitry 534 monitors the resistance control value and is thus aware of the "variable resistance value" (e.g., gain level of the amplifier stage 550) present in the oscillator circuit at any given time.

The voltage detector 532, which may be implemented on the oscillator circuit 510 or external to the oscillator circuit, receives the oscillator signal and is configured to compare the amplitude of the oscillator signal with a reference value. The voltage detector sets an amplitude flag when the oscillator signal's amplitude is higher than a predefined threshold value, which is controlled by the reference value VREF. Thus, in this example, the voltage detector 532 is the detection circuitry and the amplitude flag is the quality indicator. The control and monitor circuitry 534 monitors the amplitude flag to determine whether the oscillator signal is satisfactory. The control and monitor circuitry 534 determines the negative resistance margin based on the value of the resistance control signal at the time the amplitude flag is reset.

FIG. 5B illustrates an exemplary voltage detector 532 that may be used in margin testing circuitry 530. The voltage detector 532 includes a differential amplifier 562 that receives the oscillator signal by way of XTPAD IN and a reference voltage VREF (e.g., 0.3V) and outputs the difference. The difference between the oscillator signal and the reference voltage is filtered by filter 564. The output of the filter 564 is provided as a clock signal to a D flip flop 566 that has its data input tied to 1. In each evaluation step the variable resistance value is increased, the D flip flop is reset, and the output of the D flip flop is checked. As the amplitude of the oscillator signal decreases, the resulting clock signal approaches the VREF level. Once the clock signal becomes close enough to VREF, the clock signal is no longer sufficient to trigger the D flip flop to output a value of 1.

Referring now to FIG. 5C, a flow diagram outlines an exemplary negative margin test method 570 that may be performed by margin testing circuitry 530. At 575, the variable resistance value is set to its lowest value. At 580, an amplitude flag (e.g., the output of D flip flop 566 is) checked and at 585 a determination is made as to whether the amplitude flag has been set (e.g., equals 1 rather than 0). If the amplitude flag is set, at 590 the variable resistance is increased and the D flip flop is reset. At 580 the amplitude flag is checked again. This sweep of increasing variable resistance values is performed until the amplitude flag is not set at 585. At 595, the negative resistance margin is determined based on the value of the variable resistance when the amplitude flag failed to set. A margin signal may be provided or displayed that communicates the negative resistance margin. The use of a voltage detector rather than a PLL (see FIG. 4A) may be advantageous to avoid the disruption of the microcontroller when the PLL loses lock on the oscillator signal.

Figure 6A:
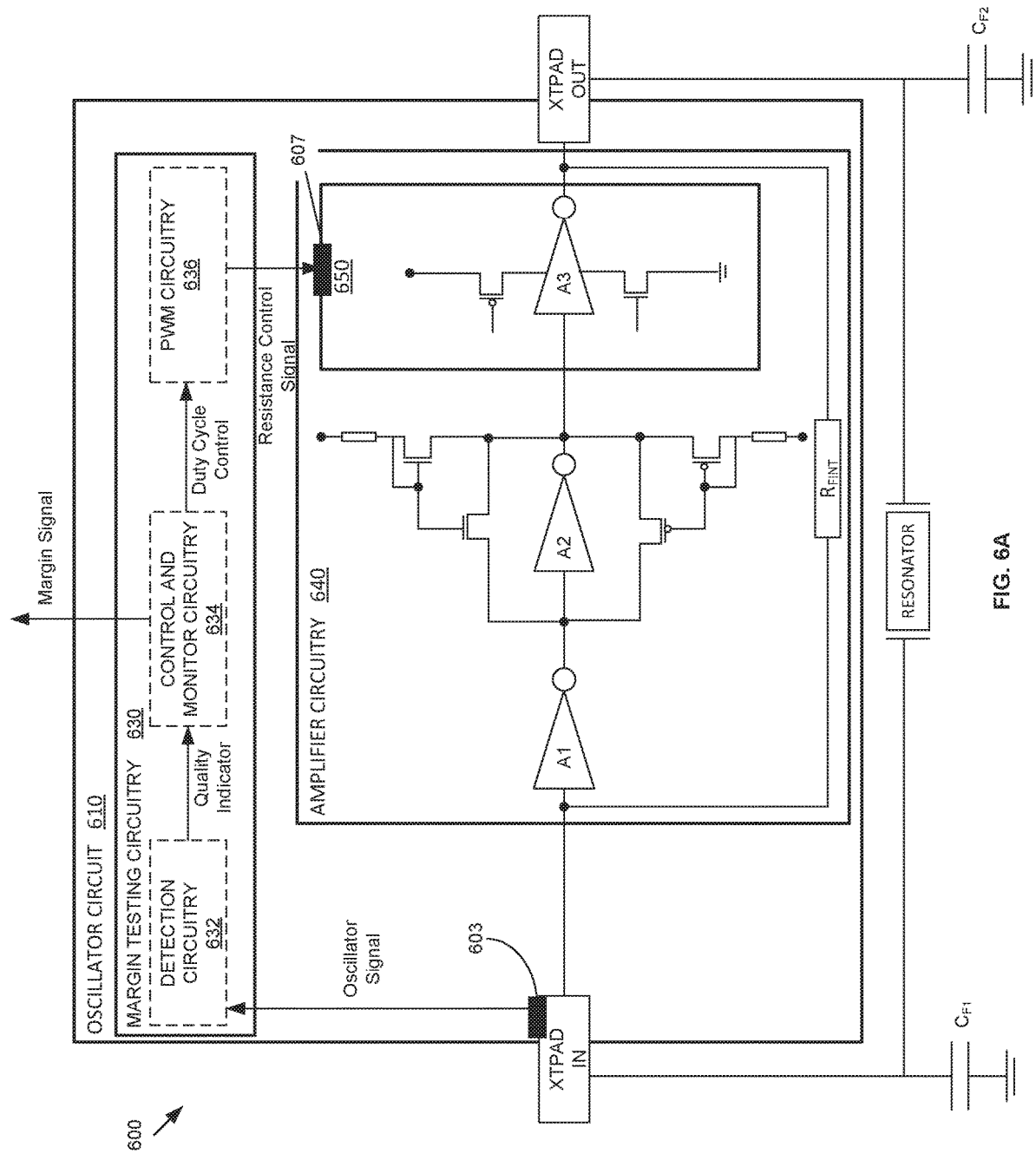
FIG. 6A is a block diagram of an exemplary oscillator circuit having pulse-width modulation (PWM) circuitry that controls negative resistance of the oscillator circuit in accordance with various aspects discussed.

FIG. 6A illustrates an exemplary oscillator system 600 that supports negative resistance margin testing in which resistance control circuitry includes a PWM signal generator. Amplifier circuitry 640 includes three gain stages A1, A2, and A3. The output stage A3 is a PWM controlled gain stage that serves as variable resistance circuitry 650. In other examples a different amplifier stage may serve as variable resistance circuitry 650. PWM circuitry 636 generates a PWM signal that has a variable duty cycle to control the gain of the amplifier stage 650. In one example, the PWM circuitry 636 includes a generic timer module (GTM) which is a common component found in many automotive microcontrollers.

During negative resistance margin testing the PWM circuitry 636 generates a PWM signal having a duty cycle that modulates the ON resistance of the amplifier stage 650. The PWM circuitry 636 may be controlled by software (e.g., control and monitor circuitry 634) to control the duty cycle of the PWM signal to adjust the gain of the amplifier stage 550 from a very high level (e.g., 100% duty cycle which results in lowest variable resistance) to incrementally lower values (e.g., duty cycles <100% which result in higher variable resistance). The control and monitor circuitry 534 monitors the duty cycle being provided to the amplifier stage 650.

Detection circuitry 632 (e.g., PLL or voltage detector), which may be implemented on the oscillator circuit 610 or external to the oscillator circuit, monitors the oscillator signal and generates a quality indicator that indicates a satisfactory oscillator signal or an unsatisfactory oscillator signal. The control and monitor circuitry 634 monitors the quality indicator to determine whether the oscillator signal is satisfactory. The control and monitor circuitry 634 determines the negative resistance margin based on the duty cycle of the resistance control signal at the time the quality indicator indicates an unsatisfactory oscillator signal. The control and monitor circuitry 634 outputs a margin signal that communicates the determined negative resistance margin.

Figure 6B:
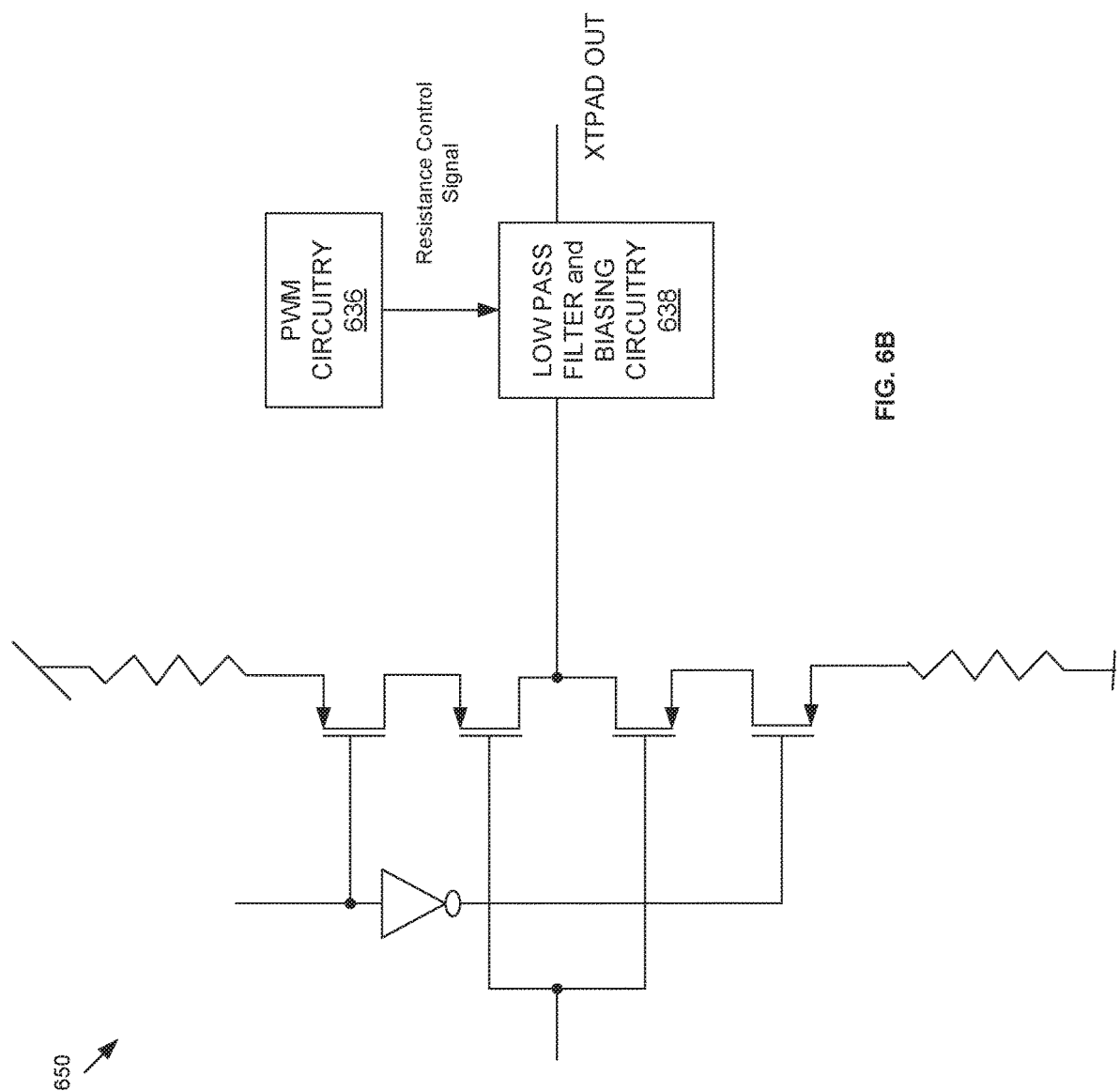
FIG. 6B is a block diagram of exemplary PWM circuitry of FIG. 6A and a variable gain amplifier stage, in accordance with various aspects described.
Figure 6C:
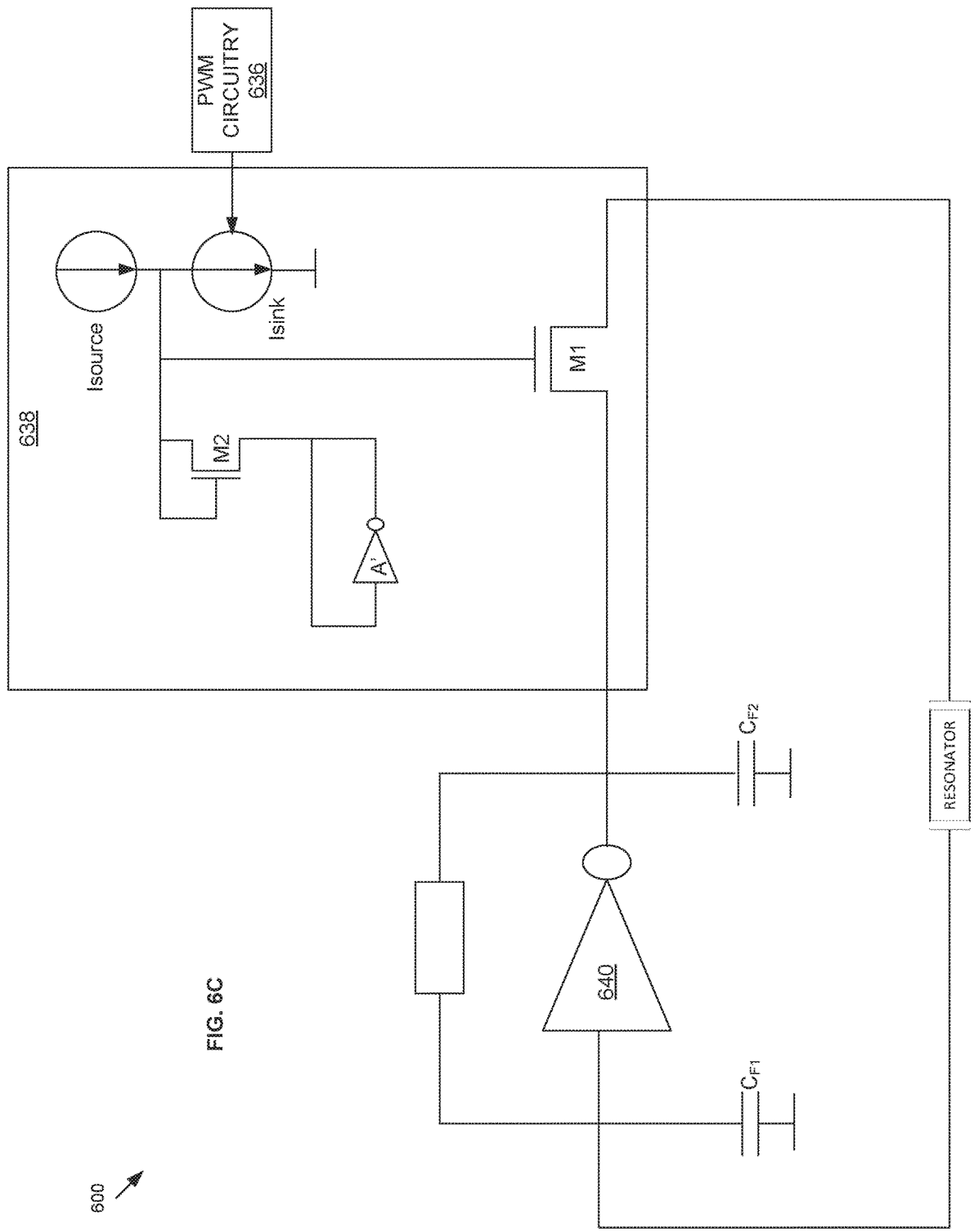
FIG. 6C is a block diagram of exemplary PWM circuitry of FIG. 6A, in accordance with various aspects described.

FIG. 6B illustrates an exemplary PWM controlled amplifier driver stage 650. The PWM resistance control signal, which may be generated by a software-controlled GTM, is first processed by a low pass filter (LPF) and biasing circuitry 638 and injected into the amplifier driver stage 650. FIG. 6C illustrates the LPF and biasing circuitry 638 in more detail. The LPF and biasing circuitry 638 includes a CMOS switch M1 which is used as a variable resistor in series with the amplifier circuitry 640 (note that the footprint capacitances $C_{F1}$ and $C_{F2}$ are associated with the microcontroller). The LPF and biasing circuitry 638 includes a replica of oscillator output voltage A', second CMOS switch M2 (which is a replica of M1), Isource (which is a constant current from a current mirror), and Isink (which is the current from the current mirror that can be switched on or off by the timer circuit). It can be seen that the gate of M1 will be one Vth higher than the oscillator output voltage when Isink is off.

Figure 6D:
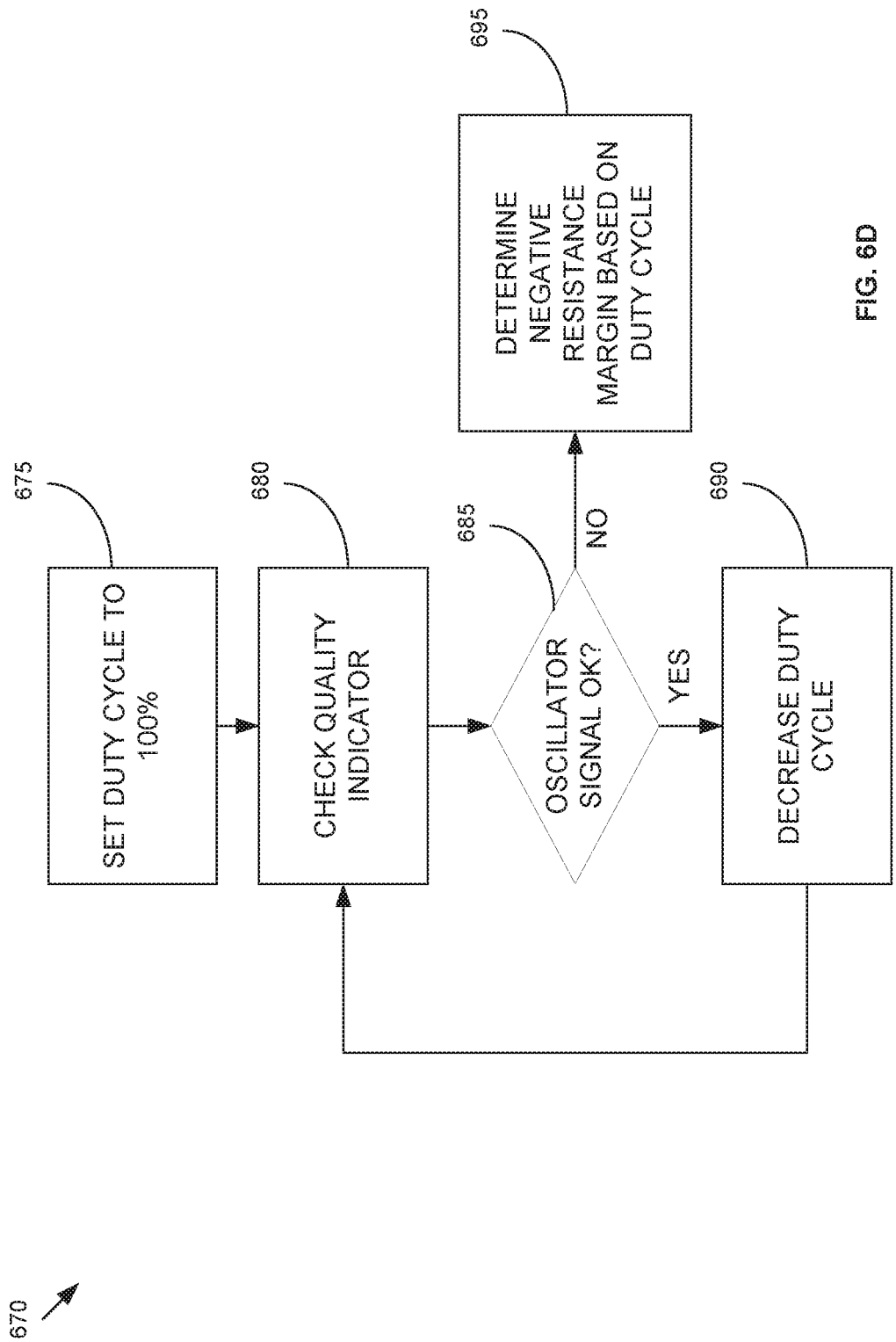
FIG. 6D is a flow diagram outlining an exemplary method for estimating a negative resistance margin of the oscillator circuit in accordance with various aspects described.

Referring now to FIG. 6D, a flow diagram outlines an exemplary negative margin test method 670 that may be performed by margin testing circuitry 630. At 675, the variable resistance value is set to its lowest value by setting the duty cycle of the PWM resistance control signal to 100%. At 680, the quality indicator is checked and at 685 a determination is made as to whether the quality indicator indicates a satisfactory oscillator signal or an unsatisfactory oscillator signal. If the oscillator signal is satisfactory, at 690 the duty cycle is decreased (to increase the variable resistance value) and the quality indicator is checked again at 680. This sweep of increasing variable resistance values is performed until the quality indicator indicates an unsatisfactory oscillator signal at 685. At 695, the negative resistance margin is determined based on the value of the duty cycle when the quality indicator indicates an unsatisfactory oscillator signal. A margin signal may be provided or displayed that communicates the negative resistance margin.

In addition to determining a design margin for negative resistance, the above described systems, methods, and techniques may be adapted for use during normal operation of the microcontroller to allow the oscillator circuit to dynamically adapt the variable resistance of the oscillator circuitry to compensate for variation in system conditions such as temperature and aging effects. In this example, control and monitor circuitry may be active during normal operation to dynamically adapt the variable resistance of the oscillator circuit to maintain the quality of the oscillator signal. Detection circuitry may continuously or periodically monitor the oscillator signal and generate the quality indicator. In response to the quality indicator indicating an unsatisfactory oscillator signal, the control and monitor circuitry may control resistance control circuitry (e.g., GTM) to provide a resistance control signal that adjusts the variable resistance until the quality indicator indicates that the oscillator signal is again satisfactory. The variable resistance circuitry may then set or maintain the resistance control signal to this value (e.g., a certain duty cycle) so that the oscillator signal remains satisfactory.

Referring now to FIG. 7, a flow diagram outlines an exemplary method 700 for dynamically controlling an oscillator circuit. At 710, a quality indicator that indicates a satisfactory oscillator signal or unsatisfactory oscillator signal is monitored. When the quality indicator indicates an unsatisfactory oscillator signal at 720, a value of a variable resistance in the oscillator circuit is adjusted at 730 and the quality indicator is checked again at 710. The process continues until the quality indicator indicates a satisfactory oscillator signal at 720 at which time the variable resistance is maintained at the identified value.

It can be seen from the foregoing description that the described systems, circuitries, and methods significantly simplify the process of negative resistance margin testing of oscillator circuits by providing a built-in variable resistance feature that can be controlled to generate different resistance values.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, circuitries, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform margin testing according to embodiments and examples described herein.

Example 1 is an oscillator circuit, including amplifier circuitry configured to be coupled in parallel with a resonator; and variable resistance circuitry configured to, in response to a resistance control signal, adjust a resistance of the oscillator circuit.

Example 2 includes the subject matter of example 1, including or omitting option elements, wherein the variable resistance circuitry includes a gain stage of the amplifier circuitry.

Example 3 includes the subject matter of example 1, including or omitting option elements, wherein the variable resistance circuitry includes a pulse width modulation (PWM) controlled stage of the amplifier circuitry.

Example 4 includes the subject matter of examples 1-3, including or omitting option elements, further including resistance control circuitry configured to generate a PWM signal for use as the resistance control signal.

Example 5 includes the subject matter of example 4, including or omitting option elements, wherein the resistance control circuitry includes a generic timer module (GTM).

Example 6 includes the subject matter of examples 1-5, including or omitting option elements, further including detection circuitry configured to detect a characteristic of an oscillator signal generated by the oscillator circuit in response to the resistance control signal; and generate a quality indicator that indicates a satisfactory oscillator signal or an unsatisfactory oscillator signal.

Example 7 includes the subject matter of example 6, including or omitting option elements, wherein the quality indicator includes a lock flag; and the detection circuitry includes a phase locked loop (PLL) configured to reset the lock flag when the PLL becomes unsynchronized with the oscillator signal.

Example 8 includes the subject matter of example 6, including or omitting option elements, wherein the quality indicator includes an amplitude flag; and the detection circuitry includes a voltage detector configured to compare an amplitude of the oscillator signal to a reference voltage and set the amplitude flag when the amplitude of the oscillator signal falls below the reference voltage.

Example 9 includes the subject matter of example 6 including or omitting option elements, further including resistance control circuitry configured to provide the resistance control signal to the variable resistance circuitry; and control and monitor circuitry in communication with the detection circuitry and the resistance control circuitry. The control and monitor circuitry is configured to control the resistance control circuitry to adjust a resistance control signal value; monitor the quality indicator; identify a resistance control signal value that results in a quality indicator that indicates an unsatisfactory oscillator signal; and generate a margin signal based on the identified resistance control signal value.

Example 10 includes the subject matter of example 9, including or omitting option elements, wherein the variable resistance circuitry includes a pulse width modulation (PWM) controlled stage of the amplifier circuitry; and the resistance control circuitry is configured to generate a PWM signal having a duty cycle as the resistance control signal. The control and monitoring circuitry is configured to identify the duty cycle of the PWM signal that results in the quality indicator that indicates an unsatisfactory oscillator signal; and generate the margin signal based on the duty cycle.

Example 11 is a method, including controlling a variable resistance value of an oscillator circuit to an initial resistance value; monitoring a quality indicator that indicates a satisfactory oscillator signal or unsatisfactory oscillator signal; adjusting the variable resistance value until the quality indicator indicates an unsatisfactory oscillator signal; and determining a negative resistance margin based on the variable resistance value that results in the unsatisfactory oscillator signal.

Example 12 includes the subject matter of example 11, including or omitting option elements, including adjusting the variable resistance value by adjusting a duty cycle of a pulse-width modulated (PWM) signal that is provided to an amplifier stage of the oscillator circuit.

Example 13 includes the subject matter of example 12, including or omitting option elements, including generating the PWM signal using a generic timer module (GTM).

Example 14 includes the subject matter of examples 11-13, including or omitting option elements, including generating the quality indicator by setting or resetting a lock flag with a phase locked loop (PLL).

Example 15 includes the subject matter of examples 11-13, including or omitting option elements, including generating the quality indicator by setting or resetting an amplitude flag with a voltage detector configured to compare an amplitude of an oscillator signal generated by the oscillator circuit to a reference voltage.

Example 16 is a method, including monitoring a quality indicator that indicates a satisfactory oscillator signal or unsatisfactory oscillator signal generated by an oscillator circuit; and in response to the quality indicator indicating an unsatisfactory oscillator signal, adjusting a variable resistance value in the oscillator circuit until the quality indicator indicates a satisfactory oscillator signal.

Example 17 includes the subject matter of example 16, including or omitting option elements, including adjusting the variable resistance value by adjusting a duty cycle of a pulse-width modulated (PWM) signal that is provided to an amplifier stage of the oscillator circuit.

Example 18 includes the subject matter of example 17, including or omitting option elements, including generating the PWM signal using a generic timer module (GTM).

Example 19 includes the subject matter of examples 16-18, including or omitting option elements, including generating the quality indicator by setting or resetting a lock flag with a phase locked loop (PLL).

Example 20 includes the subject matter of examples 16-18, including or omitting option elements, including generating the quality indicator by setting or resetting an amplitude flag with a voltage detector configured to compare an amplitude an oscillator signal generated by the oscillator circuit to a reference voltage.

The foregoing description of one or more implementations provides illustration and description, but is not intended to be exhaustive or to limit the scope of the example embodiments to the precise form disclosed. Modifications and variations are possible in light of the above teachings or may be acquired from practice of various implementations of the example embodiments.

In this description and the appended claims, use of the term "determine" with reference to some entity (e.g., parameter, variable, and so on) in describing a method step or function is to be construed broadly. For example, "determine" is to be construed to encompass, for example, receiving and parsing a communication that encodes the entity or a value of an entity. "Determine" should be construed to encompass accessing and reading memory (e.g., lookup table, register, device memory, remote memory, and so on) that stores the entity or value for the entity. "Determine" should be construed to encompass computing or deriving the entity or value of the entity based on other quantities or entities. "Determine" should be construed to encompass any manner of deducing or identifying an entity or value of the entity.

As used herein, the term identify when used with reference to some entity or value of an entity is to be construed broadly as encompassing any manner of determining the entity or value of the entity. For example, the term identify is to be construed to encompass, for example, receiving and parsing a communication that encodes the entity or a value of the entity. The term identify should be construed to encompass accessing and reading memory (e.g., device queue, lookup table, register, device memory, remote memory, and so on) that stores the entity or value for the entity.

As used herein, the term select when used with reference to some entity or value of an entity is to be construed broadly as encompassing any manner of determining the entity or value of the entity from amongst a plurality or range of possible choices. For example, the term select is to be construed to encompass accessing and reading memory (e.g., lookup table, register, device memory, remote memory, and so on) that stores the entities or values for the entity and returning one entity or entity value from amongst those stored. The term select is to be construed as applying one or more constraints or rules to an input set of parameters to determine an appropriate entity or entity value. The term select is to be construed as broadly encompassing any manner of choosing an entity based on one or more parameters or conditions.

As used herein, the term derive when used with reference to some entity or value of an entity is to be construed broadly. "Derive" should be construed to encompass accessing and reading memory (e.g., lookup table, register, device memory, remote memory, and so on) that stores some initial value or foundational values and performing processing and/or logical/mathematical operations on the value or values to generate the derived entity or value for the entity. "Derive" should be construed to encompass computing or calculating the entity or value of the entity based on other quantities or entities. "Derive" should be construed to encompass any manner of deducing or identifying an entity or value of the entity.

Various illustrative logics, logical blocks, modules, circuitries, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In the present disclosure like reference numerals are used to refer to like elements throughout, and wherein the illustrated structures and devices are not necessarily drawn to scale. As utilized herein, terms "module", "component," "system," "circuit," "circuitry," "element," "slice," and the like are intended to refer to a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuitries can reside within a process, and circuitry can be localized on one computer and/or distributed between two or more computers. A set of elements or a set of other circuitry can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include field gates, logical components, hardware encoded logic, register transfer logic, one or more processors therein to execute software and/or firmware that confer(s), at least in part, the functionality of the electronic components.

It will be understood that when an element is referred to as being "electrically connected" or "electrically coupled" to another element, it can be physically connected or coupled to the other element such that current and/or electromagnetic radiation can flow along a conductive path formed by the elements. Intervening conductive, inductive, or capacitive elements may be present between the element and the other element when the elements are described as being electrically coupled or connected to one another. Further, when electrically coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Use of the word exemplary is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. As used herein the term "or" includes the option of all elements related by the word or. For example A or B is to be construed as include only A, only B, and both A and B. Further the phrase "one or more of" followed by A, B, or C is to be construed as including A, B, C, AB, AC, BC, and ABC

What is claimed is:

1. An oscillator circuit, comprising:
   amplifier circuitry configured to be coupled in parallel with a resonator, wherein the amplifier circuitry includes a pulse width modulation (PWM) controlled gain stage;
   resistance control circuitry comprising a generic timer module configured to generate a resistance control signal; and
   variable resistance circuitry comprising the PWM controlled gain stage, wherein the variable resistance circuitry is configured to, in response to the resistance control signal, generate a PWM signal to adjust a gain of the PWM controlled gain stage to adjust a resistance of the oscillator circuit.

2. An oscillator circuit, comprising:
   amplifier circuitry configured to be coupled in parallel with a resonator, wherein the amplifier circuitry includes at least one gain stage;
   resistance control circuitry configured to generate a resistance control signal;
   variable resistance circuitry comprising a selected one of the at least one gain stage, wherein the variable resistance circuitry is configured to, in response to the resistance control signal, adjust a gain of the selected one of the at least one gain stage to adjust a resistance of the oscillator circuit; and
   detection circuitry comprising a phase locked loop (PLL) configured to
      determine when the PLL becomes unsynchronized with an oscillator signal generated by the oscillator circuit in response to the resistance control signal; and
      reset a lock flag when the PLL becomes unsynchronized with the oscillator signal to indicate
   an unsatisfactory oscillator signal.

3. An oscillator circuit, comprising:
   amplifier circuitry configured to be coupled in parallel with a resonator, wherein the amplifier circuitry includes at least one gain stage;
   resistance control circuitry configured to generate a resistance control signal;
   variable resistance circuitry comprising a selected one of the at least one gain stage, wherein the variable resistance circuitry is configured to, in response to the resistance control signal, adjust a gain of the selected one of the at least one gain stage to adjust a resistance of the oscillator circuit;
   detection circuitry configured to
      detect a characteristic of an oscillator signal generated by the oscillator circuit in response to the resistance control signal; and
      generate a quality indicator that indicates a satisfactory oscillator signal or an unsatisfactory oscillator signal;
   resistance control circuitry configured to provide the resistance control signal to the variable resistance circuitry; and
   control and monitor circuitry in communication with the detection circuitry and the resistance control circuitry, wherein the control and monitor circuitry is configured to:
      control the resistance control circuitry to adjust a resistance control signal value;
      monitor the quality indicator;
      identify a resistance control signal value that results in a quality indicator that indicates an unsatisfactory oscillator signal; and
      generate a margin signal based on the identified resistance control signal value.

4. The oscillator circuit of claim 3, wherein:
   the variable resistance circuitry comprises a pulse width modulation (PWM) controlled stage of the amplifier circuitry;
   the resistance control circuitry is configured to generate a PWM signal having a duty cycle as the resistance control signal; and
   the control and monitoring circuitry is configured to:
      identify the duty cycle of the PWM signal that results in the quality indicator that indicates an unsatisfactory oscillator signal; and
      generate the margin signal based on the duty cycle.

5. A method, comprising:
   controlling a gain of an amplifier gain stage of an oscillator circuit to an initial gain value;
   monitoring a quality indicator that indicates a satisfactory oscillator signal or unsatisfactory oscillator signal;
   adjusting the gain value until the quality indicator indicates an unsatisfactory oscillator signal; and
   determining a negative resistance margin based on the gain value that results in the unsatisfactory oscillator signal.

6. The method of claim 5, comprising adjusting the gain value by adjusting a duty cycle of a pulse-width modulated (PWM) signal that is provided to the amplifier gain stage of the oscillator circuit.

7. The method of claim 6, comprising generating the PWM signal using a generic timer module (GTM).

8. The method of claim 5, comprising generating the quality indicator by setting or resetting a lock flag with a phase locked loop (PLL).

9. The method of claim 5, comprising generating the quality indicator by setting or resetting an amplitude flag with a voltage detector configured to compare an amplitude of an oscillator signal generated by the oscillator circuit to a reference voltage.

10. A method, comprising:
    monitoring a lock flag set by a phase locked loop (PLL) that indicates a satisfactory oscillator signal is generated by an oscillator circuit when the PLL is locked to an oscillator signal or unsatisfactory oscillator signal is generated by the oscillator circuit when the PLL is not locked to the oscillator signal; and
    in response to the lock flag indicating an unsatisfactory oscillator signal, adjusting a variable resistance value in the oscillator circuit until the lock flag indicates a satisfactory oscillator signal.

11. The method of claim 10, comprising adjusting the variable resistance value by adjusting a duty cycle of a pulse-width modulated (PWM) signal that is provided to an amplifier stage of the oscillator circuit.

12. The method of claim 11, comprising generating the PWM signal using a generic timer module (GTM).

* * * * *